United States Patent
Yoshikawa (10) Patent No.: US 12,302,593 B2
(45) Date of Patent: May 13, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Daiki Yoshikawa, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 384 days.

(21) Appl. No.: 17/901,632

(22) Filed: Sep. 1, 2022

(65) Prior Publication Data

US 2023/0307530 A1 Sep. 28, 2023

(30) Foreign Application Priority Data

Mar. 22, 2022 (JP) .................. 2022-045016

(51) Int. Cl.
 *H01L 29/739* (2006.01)
 *H01L 29/06* (2006.01)
 (Continued)

(52) U.S. Cl.
 CPC ......... *H10D 12/481* (2025.01); *H10D 62/127* (2025.01); *H10D 64/513* (2025.01)

(58) Field of Classification Search
 None
 See application file for complete search history.

(56) References Cited

U.S. PATENT DOCUMENTS 9,853,024 B2 12/2017 Senoo et al.
10,355,124 B1 * 7/2019 Asahara .............. H01L 29/1037
(Continued)

FOREIGN PATENT DOCUMENTS

JP 2007-221012 A 8/2007
JP 2013-229399 A 11/2013
(Continued)

OTHER PUBLICATIONS

Notice of Reasons for Refusal (Office Action) dated Mar. 11, 2025 in corresponding Japanese Patent Application No. 2022-045016 with English machine translation (8 pages).

*Primary Examiner* — Alexander G Ghyka
(74) *Attorney, Agent, or Firm* — Kim & Stewart LLP (57) ABSTRACT

A semiconductor device includes first to third electrodes, first to fifth semiconductor regions, and a first contact region. The third semiconductor region is located on the second semiconductor region. The fourth semiconductor region is located on a portion of the third semiconductor region. The third electrode extends in a second direction and faces the third semiconductor region via a first insulating film in a third direction. The first contact region is located on a portion of the third semiconductor region and is arranged with the third electrode in the third direction. The fifth semiconductor region includes a first portion and a second portion. The first portion is arranged in the third direction with a boundary portion between the first insulating film and the third semiconductor region between the second semiconductor region and the fourth semiconductor region. The second portion is arranged in the second direction with the boundary portion.

8 Claims, 11 Drawing Sheets

(51) Int. Cl.
  *H01L 29/423*   (2006.01)
  *H10D 12/00*   (2025.01)
  *H10D 62/10*   (2025.01)
  *H10D 64/27*   (2025.01)

(56) References Cited

U.S. PATENT DOCUMENTS

| | | |
|---|---|---|
| 2013/0277734 A1 | 10/2013 | Nishiguchi et al. |
| 2015/0021657 A1* | 1/2015 | Ogura ............... H01L 29/1095 257/139 |
| 2017/0005186 A1* | 1/2017 | Hirabayashi ............ H01L 29/36 |
| 2017/0141217 A1 | 5/2017 | Shirakawa et al. |
| 2019/0214383 A1* | 7/2019 | Nagai ................. H01L 29/8613 |
| 2021/0296477 A1* | 9/2021 | Matsudai ............... H01L 29/417 |
| 2022/0102341 A1* | 3/2022 | Kudo ................. H01L 29/0623 |

FOREIGN PATENT DOCUMENTS

| | | |
|---|---|---|
| JP | 6003961 B2 | 10/2016 |
| JP | 6852541 B2 | 3/2021 |
| WO | 2016133027 A1 | 8/2016 |

\* cited by examiner

SEMICONDUCTOR DEVICE

CROSS-REFERENCE TO RELATED APPLICATIONS

This application is based upon and claims the benefit of priority from Japanese Patent Application No. 2022-045016, filed on Mar. 22, 2022; the entire contents of which are incorporated herein by reference.

FIELD

Embodiments relate to a semiconductor device.

BACKGROUND

Latchup caused by the operation of parasitic elements may occur in, for example, semiconductor devices such as IGBTs (Insulated Gate Bipolar Transistors) and the like. Discrepancies such as misoperations and the like may occur when latchup occurs.

DETAILED DESCRIPTION

A semiconductor device according to one embodiment, includes a first electrode, a second electrode, a first semiconductor region, a second semiconductor region, a third semiconductor region, a fourth semiconductor region, a third electrode, a first contact region, and a fifth semiconductor region. The first semiconductor region is located on the first electrode. The first semiconductor region is of a first conductivity type. The second semiconductor region is located on the first semiconductor region. The second semiconductor region is of a second conductivity type. The third semiconductor region is located on the second semiconductor region. The third semiconductor region is of the first conductivity type. The fourth semiconductor region is located on a portion of the third semiconductor region and electrically connected with the second electrode. The fourth semiconductor region is of the second conductivity type. The third electrode extends in a second direction and faces the third semiconductor region via a first insulating film in a third direction. The second direction is perpendicular to a first direction. The first direction is from the first semiconductor region toward the second semiconductor region. The third direction is perpendicular to the first and second directions. The first contact region is located on a portion of the third semiconductor region. The first contact region is arranged with the third electrode in the third direction, and electrically connected with the second electrode. The first contact region is of the first conductivity type and has a higher first-conductivity-type impurity concentration than the third semiconductor region. The fifth semiconductor region is connected with the first contact region. The fifth semiconductor region is of the first conductivity type and has a higher first-conductivity-type impurity concentration than the third semiconductor region. The fifth semiconductor region includes a first portion and a second portion. The first portion is arranged in the third direction with a boundary portion between the first insulating film and the third semiconductor region between the second semiconductor region and the fourth semiconductor region. The second portion is arranged in the second direction with the boundary portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the embodiments described below, each embodiment may be implemented by inverting the p-type (an example of the first conductivity type) and the n-type (an example of the second conductivity type) of each semiconductor region.

Figure 1A:
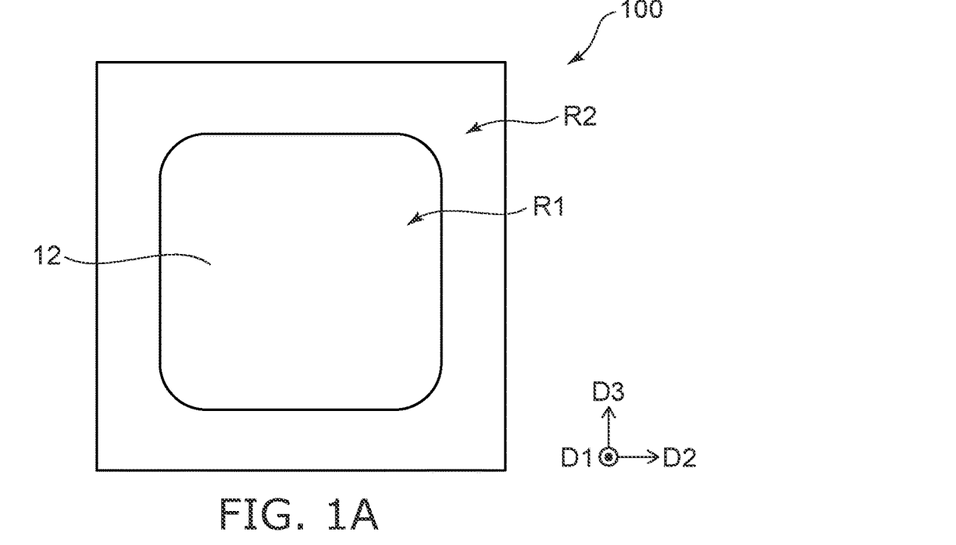
FIGS. 1A and 1B are schematic plan views illustrating a semiconductor device according to an embodiment.
Figure 1B:
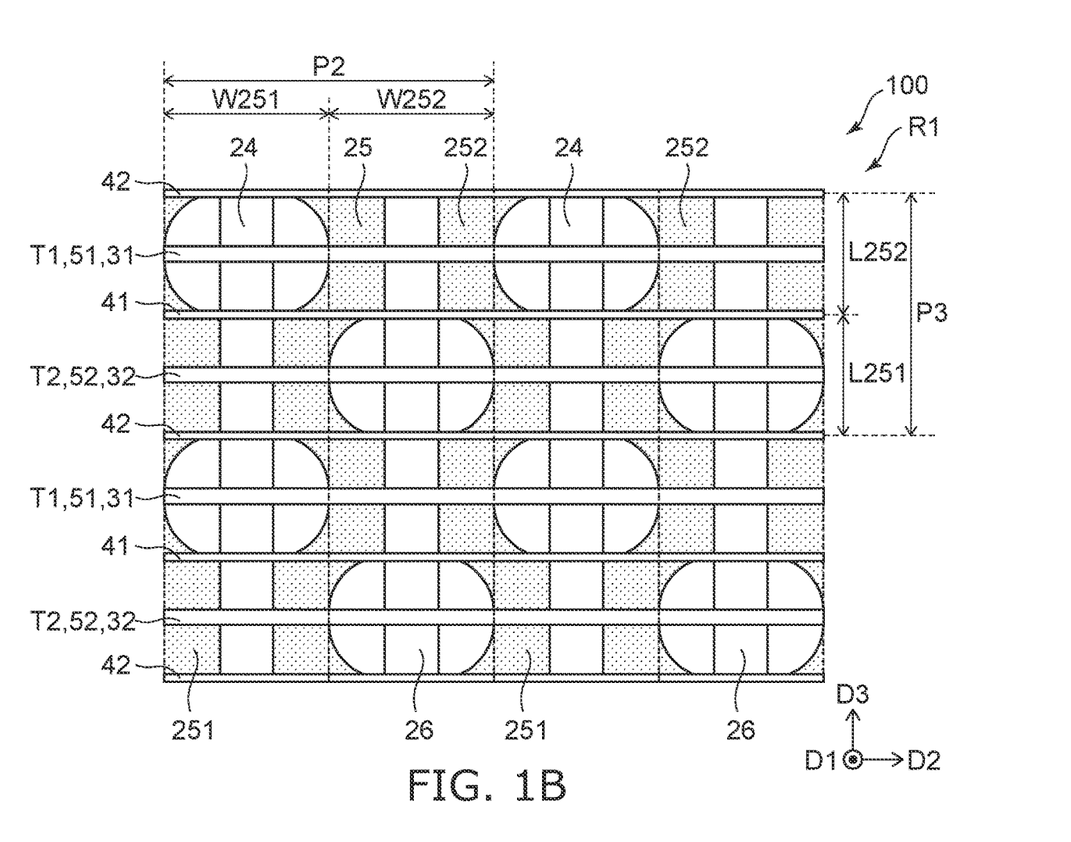

FIGS. 1A and 1B are schematic plan views illustrating a semiconductor device according to an embodiment. As illustrated in FIG. 1A, the semiconductor device 100 includes, for example, an element region R1 and a termination region R2. The outer perimeter of the element region R1 is surrounded with the termination region R2. The termination region R2 may include guard rings, etc., as appropriate. A first electrode 11 (see FIG. 3) is located at the back surface of the semiconductor device 100; and a second electrode 12 is located at the front surface of the element region R1.

FIG. 1B is an enlarged illustration of a portion of the layout of layers under the second electrode 12. In the example as illustrated in FIG. 1B, the semiconductor device 100 has a periodic repeating structure.

A first direction D1, a second direction D2, and a third direction D3 are used in the description of the embodiment. The direction from the first electrode 11 toward the second electrode 12 is taken as the first direction D1. One direction perpendicular to the first direction D1 is taken as the second direction D2. A direction that is perpendicular to the first direction D1 and perpendicular to the second direction D2 is taken as the third direction D3. In the description, the direction from the first electrode 11 toward the second electrode 12 is called "up", and the opposite direction is called "down". These directions are based on the relative positional relationship between the first electrode 11 and the second electrode 12 and are independent of the direction of gravity.

Figure 2:
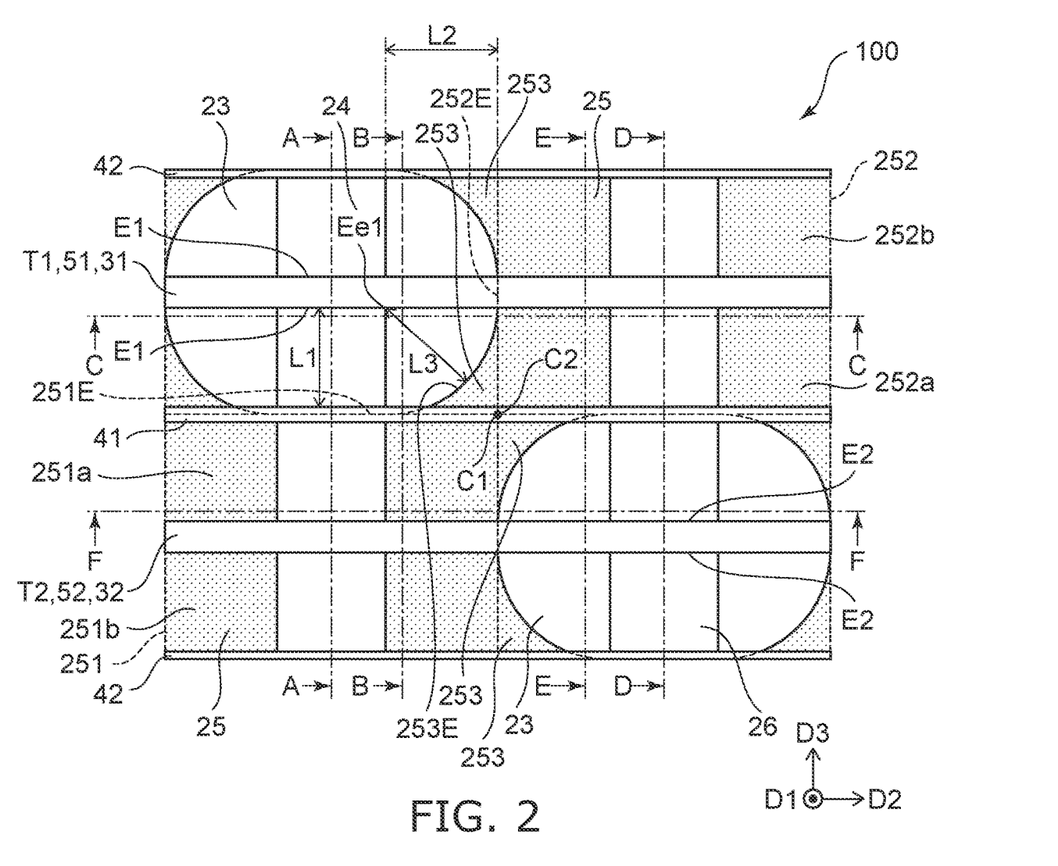
FIG. 2 is a schematic plan view illustrating the semiconductor device according to the embodiment.

FIG. 2 is a schematic plan view illustrating the semiconductor device according to the embodiment.

For example, FIG. 2 illustrates one of the unit structures repeated in FIG. 1B. That is, in the semiconductor device 100, the structure shown in FIG. 2 is periodically arranged in the second and third directions D2 and D3. In the example, the semiconductor device 100 is an IGBT.

The semiconductor device 100 includes multiple trenches (multiple first trenches T1 and multiple second trenches T2). The first trenches T1 and the second trenches T2 extend in the second direction D2. The multiple trenches are arranged in the third direction D3.

The semiconductor device 100 includes multiple insulating films (multiple first insulating films 51 and multiple second insulating films 52) and multiple conductive parts (multiple first conductive parts 31 and multiple second conductive parts 32) located inside the multiple trenches. The first insulating film 51 (e.g., a first gate insulating film) and the first conductive part 31 (a third electrode (e.g., a first gate electrode)) are located inside the first trench T1 and extend in the second direction D2. The second insulating film 52 (e.g., a second gate insulating film) and the second conductive part 32 (a fourth electrode (e.g., a second gate electrode)) are located inside the second trench T2 and extend in the second direction D2. In the example, the second conductive part 32 is electrically connected with the first conductive part 31; and the potential of the second conductive part 32 is equal to the potential of the first conductive part 31.

The semiconductor device 100 includes multiple fourth semiconductor regions 24 (e.g., first emitter regions) illustrated in FIGS. 1B and 2 on the first to third semiconductor regions (see FIG. 3) that are described below, a fifth semiconductor region 25 (e.g., a pillar region), multiple sixth semiconductor regions 26 (e.g., second emitter regions), and multiple contact regions (multiple first contact regions 41 and multiple second contact regions 42).

The first contact region 41 and the second contact region 42 are semiconductor regions of a first conductivity type (e.g., a p-type). The first contact region 41 is positioned between the first trench T1 and the second trench T2. The first trench T1 is positioned between the first contact region 41 and the second contact region 42. In other words, the first trench T1, the first contact region 41, the second trench T2, and the second contact region 42 are repeatedly arranged in this order in the third direction D3. The first contact region 41 and the second contact region 42 each extend in the second direction D2.

The fourth semiconductor region 24 and the sixth semiconductor region 26 each are of a second conductivity type (e.g., an n-type). The fourth semiconductor region 24 is arranged in the second direction D2 with the sixth semiconductor region 26. In the example, the fourth semiconductor region 24 and the sixth semiconductor region 26 each extend in the third direction D3.

The area of the fifth semiconductor region 25 is illustrated by dot cross hatching in FIG. 2 (and FIGS. 9A to 11). The fifth semiconductor region 25 is of the first conductivity type. In the example, the fifth semiconductor region 25 includes a rectangular first portion 251, a rectangular second portion 252, and a connection portion 253 that connects the first portion 251 and the second portion 252.

For example, the fifth semiconductor region 25 is periodically located in a checkered pattern formed of the first and second portions 251 and 252. As illustrated in FIG. 1B, for example, a length W251 in the second direction D2 of the first portion 251 and a length W252 in the second direction D2 of the second portion 252 each are equal to half of a period P2 in the second direction D2 of the second portion 252. As illustrated in FIG. 1B, for example, a length L251 in the third direction D3 of the first portion 251 and a length L252 in the third direction D3 of the second portion 252 each are equal to half of a period P3 of the third direction D3 of the first portion 251. As illustrated in FIG. 2, a corner portion c1 of the rectangular first portion 251 is connected with a corner portion c2 of the rectangular second portion 252 when viewed from above. For example, the first portion 251 and the second portion 252 have rectangular shapes that share a vertex. For example, the position of the vertex of the corner portion c1 matches the position of the vertex of the corner portion c2.

The connection portion 253 is positioned between one side 251E of the first portion 251 extending in the second direction D2 and one side 252E of the second portion 252 extending in the third direction D3 when viewed from above. For example, the connection portion 253 is curved and smoothly connects the first portion 251 and the second portion 252. In other words, the outer perimeter of the connection portion 253 includes a curve 253E connecting the one side 251E of the first portion 251 and the one side 252E of the second portion 252 when viewed from above.

The unit structure illustrated in FIG. 2 may be a substantially rotationally symmetric structure. For example, the unit structure has 180° symmetry with an axis extending in the first direction D1 and passing through the corner portion c1 (the vertex of the first portion 251) as the rotation axis.

The shapes of the first and second portions 251 and 252 according to the embodiment are not limited to those described above and may not always be rectangular.

Figure 3:
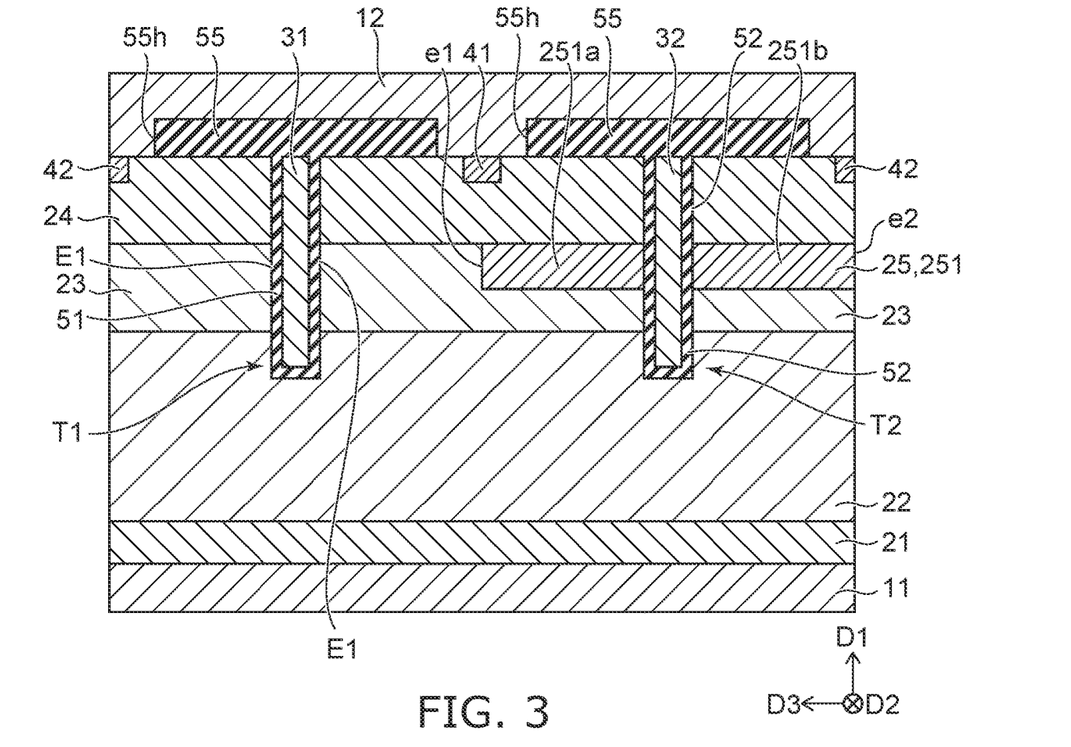
FIG. 3 is a schematic cross-sectional view illustrating the semiconductor device according to the embodiment.

FIG. 3 is a schematic cross-sectional view illustrating the semiconductor device according to the embodiment.

FIG. 3 is a line A-A cross section shown in FIG. 2. The second electrode 12, etc., also are illustrated in FIG. 3 (and FIGS. 4 to 7).

As illustrated in FIG. 3, the semiconductor device 100 according to the embodiment further includes the first electrode 11, a first semiconductor region 21, a second semiconductor region 22, a third semiconductor region 23 (e.g., a base region), an insulating film 55, and the second electrode 12.

The first electrode 11 (e.g., a collector electrode) is located at the lower surface of the semiconductor device 100. The first semiconductor region 21 (e.g., a collector region) is located on the first electrode 11 and is of the first conductivity type. The first semiconductor region 21 is electrically connected with the first electrode 11.

The second semiconductor region 22 (e.g., a drift region) is located on the first semiconductor region 21 and is of the second conductivity type. In the example, the second semiconductor region 22 is continuous with the first semiconductor region 21.

The third semiconductor region 23 (e.g., a base region) is located on the second semiconductor region 22 and is of the first conductivity type. The first-conductivity-type impurity concentration of the third semiconductor region 23 is less than the first-conductivity-type impurity concentration of the first semiconductor region 21. The third semiconductor region 23 is continuous with the second semiconductor region 22.

The fourth semiconductor region 24 is located on a portion of the third semiconductor region 23. The second-conductivity-type impurity concentration of the fourth semiconductor region 24 is greater than the first-conductivity-type impurity concentration of the second semiconductor region 22. A portion of the fourth semiconductor region 24 is continuous with the third semiconductor region 23.

The first trench T1 and the second trench T2 each are formed in the second to fourth semiconductor regions 22 to 24. In other words, the first trench T1 and the second trench T2 each reach the upper portion of the second semiconductor region 22 from above.

The first insulating film 51 is located at the inner surface (the bottom surface and the inner wall) of the first trench T1. The first conductive part 31 is located inward of the first insulating film 51 inside the first trench T1. In other words, the first insulating film 51 is located between the second semiconductor region 22 and the first conductive part 31, between the third semiconductor region and the first conductive part 31, and between the fourth semiconductor region 24 and the first conductive part 31. The first conductive part 31 faces the side surface of a portion of the second semiconductor region 22, the side surface of the third semiconductor region 23, and the side surface of the fourth semiconductor region 24 via the first insulating film 51 in the third direction D3.

Similarly, the second insulating film 52 is located at the inner surface (the bottom surface and the inner wall) of the second trench T2. The second conductive part 32 is located inward of the second insulating film 52 inside the second trench T2. In other words, the second insulating film 52 is located between the second semiconductor region 22 and the second conductive part 32, between the third semiconductor region and the second conductive part 32, and between the fourth semiconductor region 24 and the second conductive part 32. The second conductive part 32 faces the side surface of a portion of the second semiconductor region 22, the side surface of the third semiconductor region 23, and the side surface of the fourth semiconductor region 24 via the second insulating film 52 in the third direction D3.

The first contact region 41 and the second contact region 42 each are located on the third semiconductor region 23. The first-conductivity-type impurity concentration of the first contact region 41 is greater than the first-conductivity-type impurity concentration of the third semiconductor region 23 and greater than the first-conductivity-type impurity concentration of the fifth semiconductor region 25. Similarly, the first-conductivity-type impurity concentration of the second contact region 42 is greater than the first-conductivity-type impurity concentration of the third semiconductor region 23 and greater than the first-conductivity-type impurity concentration of the fifth semiconductor region 25.

At the cross section shown in FIG. 3, a portion of the first contact region 41 is positioned on the fourth semiconductor region 24 and is continuous with the fourth semiconductor region 24.

The fifth semiconductor region 25 is deeper than the fourth semiconductor region 24 (and the sixth semiconductor region 26). In the example, the fifth semiconductor region 25 is positioned on the third semiconductor region 23 and is continuous with the third semiconductor region 23. The fifth semiconductor region 25 may be continuous with the second semiconductor region 22. The first-conductivity-type impurity concentration of the fifth semiconductor region 25 is greater than the first-conductivity-type impurity concentration of the third semiconductor region 23.

The first portion 251 of the fifth semiconductor region 25 is arranged in the third direction D3 with a boundary portion E1 shown in FIG. 3. The boundary portion E1 is the boundary between the first insulating film 51 (the first trench T1) and the third semiconductor region 23 between the second semiconductor region 22 and the fourth semiconductor region 24. For example, the boundary portion E1 corresponds to the region in which a channel (an inversion layer) is formed when assuming a MOSFET (metal-oxide-semiconductor field-effect transistor) in which the first conductive part 31 is a gate, the first insulating film 51 is a gate insulating film, the second semiconductor region 22 is a source, and the fourth semiconductor region 24 is a drain. That is, the boundary portion E1 corresponds to the end portion of the third semiconductor region 23 contacting the first insulating film 51. The boundary portions E1 are positioned at the two side surfaces in the third direction D3 of the first trench T1.

One end portion e1 in the third direction D3 of the first portion 251 is positioned below the first contact region 41; and another end portion e2 in the third direction D3 of the first portion 251 is positioned below the second contact region 42.

The third semiconductor region 23 and the fourth semiconductor region 24 each are divided in the third direction D3 by the first and second trenches T1 and T2. The first portion 251 is divided in the third direction D3 by the second trench T2. Thus, the third semiconductor region 23, the fourth semiconductor region 24, and the first portion 251 each may include multiple discontinuous portions subdivided in the third direction D3. More specifically, for example, the first portion 251 includes a side portion 251a and a side portion 251b arranged in the third direction D3. The second insulating film 52 (the second trench T2) is positioned between the side portion 251a and the side portion 251b and contacts the side portions 251a and 251b.

The second electrode 12 is located on the first contact region 41, the second contact region 42, the third semiconductor region 23, and the fourth semiconductor region 24. As illustrated in FIG. 3, the second electrode 12 is in contact with and electrically connected to the first contact region 41, the second contact region 42, and the fourth semiconductor region 24.

The insulating film 55 is located between the second electrode 12 and each of the third semiconductor region 23, the fourth semiconductor region 24, the first conductive part 31, and the second conductive part 32. For example, contact holes 55h that extend through the insulating film 55 are formed in the insulating film 55. The contact holes 55h extend in the second direction D2. The second electrode 12 contacts the first contact region 41, the second contact region 42, and the fourth semiconductor region 24 inside the contact holes 55h.

Figure 4:
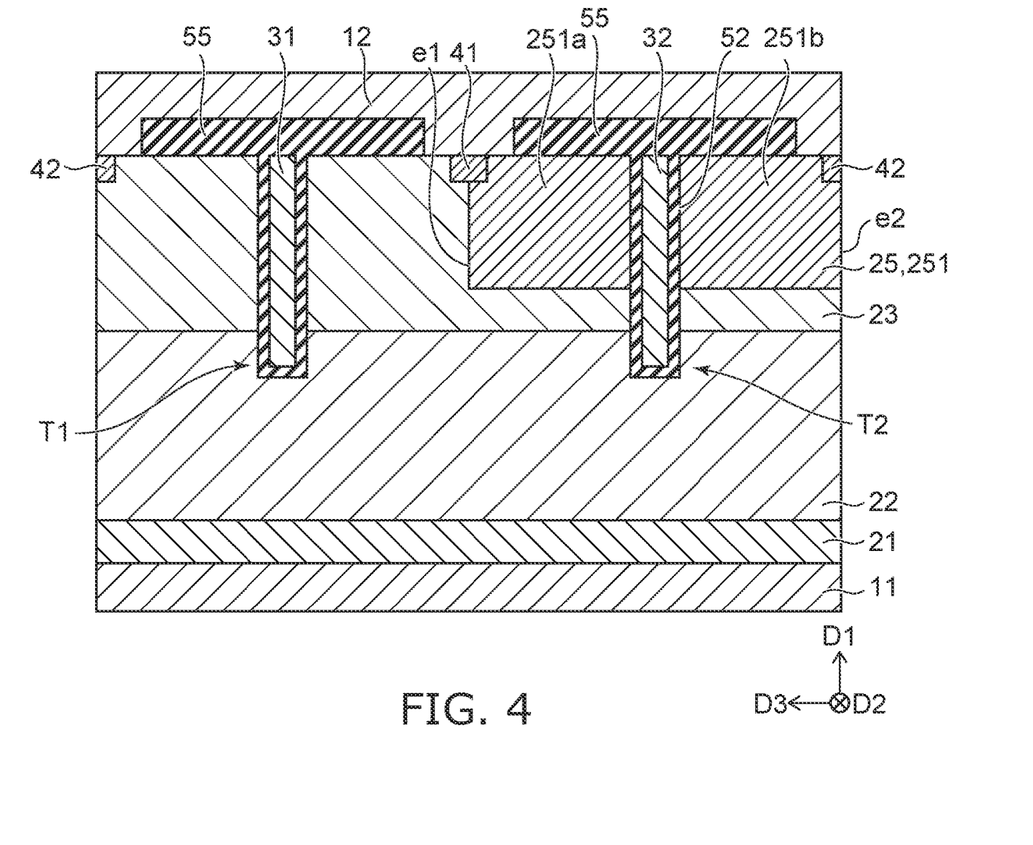
FIG. 4 is a schematic cross-sectional view illustrating the semiconductor device according to the embodiment.

FIG. 4 is a schematic cross-sectional view illustrating the semiconductor device according to the embodiment.

FIG. 4 is a line B-B cross section shown in FIG. 2. As illustrated in FIG. 4, the first portion 251 of the fifth semiconductor region 25 is electrically connected with the first contact region 41 and the second contact region 42. The side portion 251a (the end portion e1) of the first portion 251 is continuous with the first contact region 41. The side portion 251b (the end portion e2) of the first portion 251 is continuous with the second contact region 42.

A portion of the first contact region 41 and a portion of the second contact region 42 each are positioned on the third semiconductor region 23 and are continuous with the third semiconductor region 23.

Figure 5:
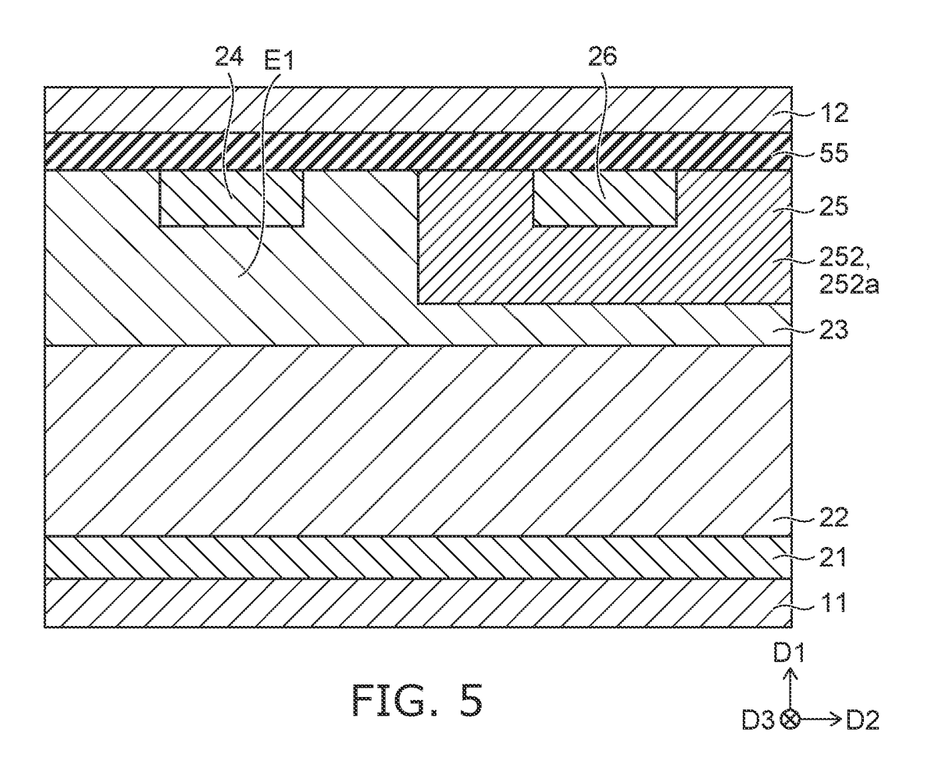
FIG. 5 is a schematic cross-sectional view illustrating the semiconductor device according to the embodiment.

FIG. 5 is a schematic cross-sectional view illustrating the semiconductor device according to the embodiment.

FIG. 5 is a line C-C cross section shown in FIG. 2. As illustrated in FIGS. 2 and 5, the second portion 252 of the fifth semiconductor region 25 is arranged in the second direction D2 with the boundary portion E1.

As illustrated in FIG. 2, it is favorable for a distance L1 between the boundary portion E1 and the first portion 251 to be equal to a distance L2 between the boundary portion E1 and the second portion 252 when viewed from above. The distance L1 is the distance along the third direction D3 to the first portion 251 from an end portion Ee1 in the second direction D2 of the boundary portion E1. The distance L2 is the distance along the second direction D2 from the end portion Ee1 to the second portion 252. For example, it is favorable for the distance L1 to be not less than 0.9 times and not more than 1.1 times the distance L2, and more favorably equal to the distance L2.

As illustrated in FIG. 2, it is favorable for the distance L1 to be equal to a distance L3 between the boundary portion E1 and the connection portion 253 when viewed from above. The distance L3 is the shortest distance from the end portion Ee1 of the boundary portion E1 to the curve 253E of the connection portion 253. For example, it is favorable for the distance L1 to be not less than 0.9 times and not more than 1.1 times the distance L3, and more favorably equal to the distance L1. For example, the curve 253E is such that the distance from the end portion Ee1 of the boundary portion E1 to the most proximate connection portion 253 is constant.

In this specification, "same" or "equal" includes not only exactly the same or equal but also the range of manufacturing fluctuation, etc.; and it is sufficient to be substantially the same or equal.

Figure 6:
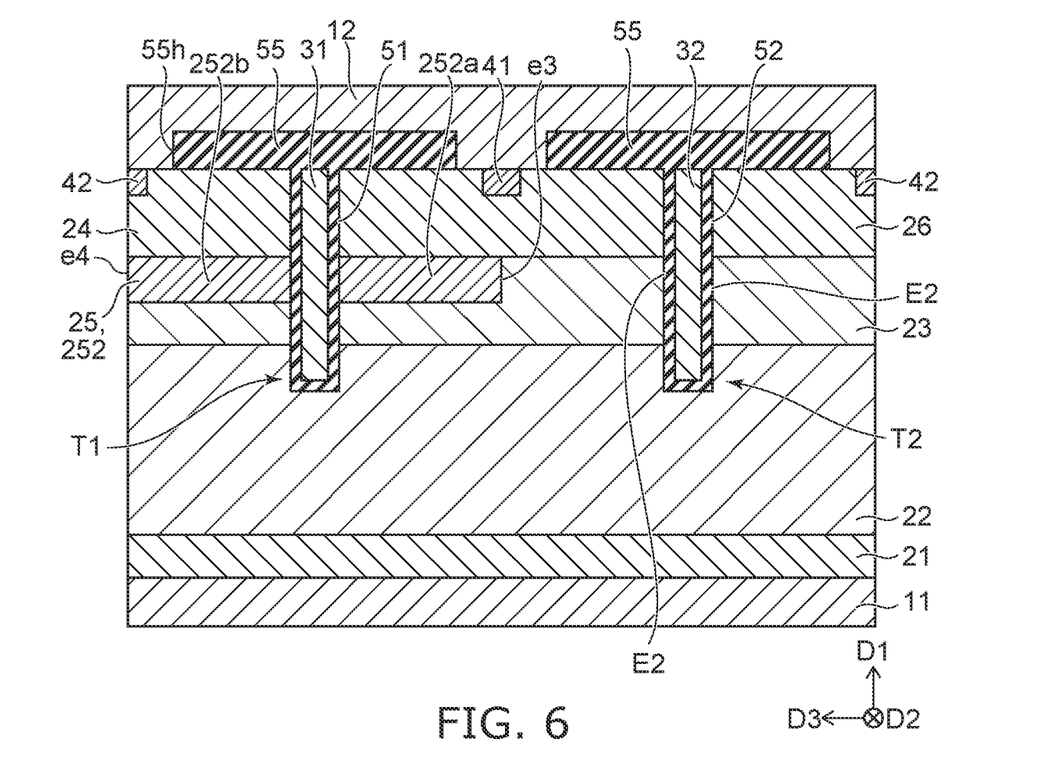
FIG. 6 is a schematic cross-sectional view illustrating the semiconductor device according to the embodiment.

FIG. 6 is a schematic cross-sectional view illustrating the semiconductor device according to the embodiment.

FIG. 6 is a line D-D cross section shown in FIG. 2. At the cross section shown in FIG. 6, a portion of the second contact region 42 is positioned on the sixth semiconductor region 26 and is continuous with the sixth semiconductor region 26.

The second portion 252 of the fifth semiconductor region 25 is arranged in the third direction D3 with a boundary portion E2 shown in FIG. 6. The boundary portion E2 is the boundary between the second insulating film 52 (the second trench T2) and the third semiconductor region 23 between the second semiconductor region 22 and the sixth semiconductor region 26. For example, the boundary portion E2 corresponds to the region in which a channel is formed when assuming a MOSFET in which the second conductive part 32 is a gate, the second insulating film 52 is a gate insulating film, the second semiconductor region 22 is a source, and the sixth semiconductor region 26 is a drain. That is, the boundary portion E2 corresponds to the end portion of the third semiconductor region 23 that contacts the second insulating film 52. The boundary portions E2 are positioned at the two side surfaces in the third direction D3 of the second trench T2.

One end portion e3 in the third direction D3 of the second portion 252 is positioned below the first contact region 41; and another end portion e4 in the third direction D3 of the second portion 252 is positioned below the second contact region 42.

The second portion 252 is divided in the third direction D3 by the first trench T1. Thus, the second portion 252 may include multiple discontinuous portions subdivided in the third direction D3. More specifically, for example, the second portion 252 includes a side portion 252a and a side portion 252b arranged in the third direction D3. The first insulating film 51 (the first trench T1) is positioned between the side portion 251a and the side portion 251b and contacts the side portions 251a and 251b.

Figure 7:
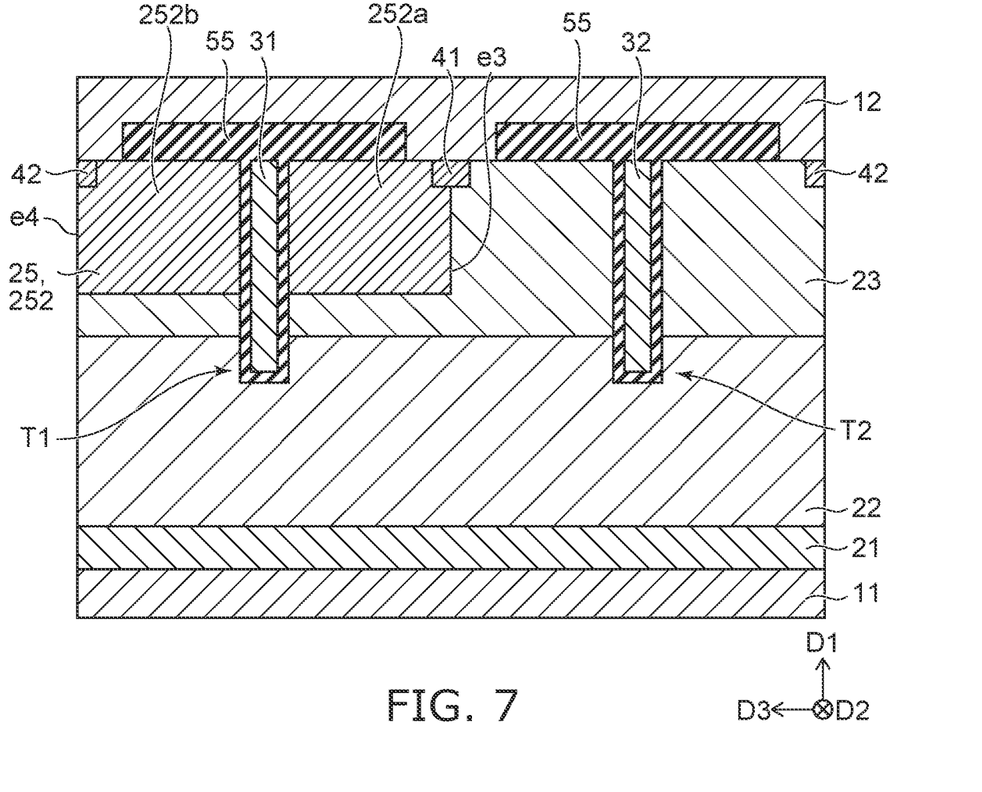
FIG. 7 is a schematic cross-sectional view illustrating the semiconductor device according to the embodiment.

FIG. 7 is a schematic cross-sectional view illustrating the semiconductor device according to the embodiment.

FIG. 7 is a line E-E cross section shown in FIG. 2. As illustrated in FIG. 7, the second portion 252 of the fifth semiconductor region 25 is electrically connected with the first contact region 41 and the second contact region 42. The side portion 252a (the end portion e3) of the second portion 252 is continuous with the first contact region 41. The side portion 252b (the end portion e4) of the second portion 252 is continuous with the second contact region 42.

Figure 8:
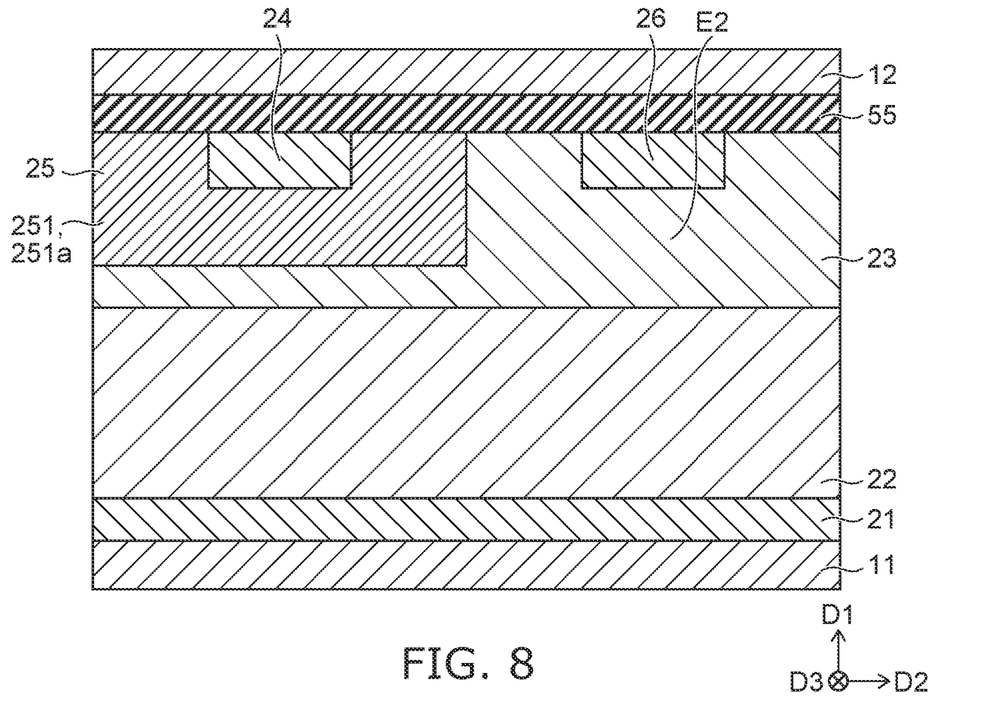
FIG. 8 is a schematic cross-sectional view illustrating the semiconductor device according to the embodiment.

FIG. 8 is a schematic cross-sectional view illustrating the semiconductor device according to the embodiment.

FIG. 8 is a line E-E cross section shown in FIG. 2. As illustrated in FIGS. 2 and 8, the first portion 251 of the fifth semiconductor region 25 is arranged in the second direction D2 with the boundary portion E2.

Examples of the materials of the components of the semiconductor device 100 will now be described.

The first to sixth semiconductor regions 21 to 26, the first contact region 41, and the second contact region 42 include silicon, silicon carbide, gallium nitride, or gallium arsenide as semiconductor materials. When silicon is used as the semiconductor material, arsenic, phosphorus, or antimony can be used as the n-type impurity. Boron can be used as the p-type impurity.

The first conductive part 31 and the second conductive part 32 include conductive materials such as polysilicon, etc. An impurity may be added to the conductive material.

The first insulating film 51, the second insulating film 52, and the insulating film 55 include insulating materials such as silicon oxide, silicon nitride, etc.

The first electrode 11 and the second electrode 12 are conductive parts that include metals such as aluminum, copper, etc.

Operations of the semiconductor device 100 will now be described.

A voltage that is not less than a threshold is applied to the first and second conductive parts 31 and 32 in a state in which a positive voltage with respect to the second electrode 12 is applied to the first electrode 11. Thereby, a channel is formed in the third semiconductor region 23 (the boundary portion E1 and the boundary portion E2); and the semiconductor device 100 is set to the on-state. As electrons pass through the channel and flow toward the second semiconductor region 22, holes are injected from the first semiconductor region 21 into the second semiconductor region 22. The electrical resistance of the semiconductor device 100 is greatly reduced by the conductivity modulation occurring in the second semiconductor region 22. Subsequently, when the voltage that is applied to the first and second conductive parts 31 and 32 drops below the threshold, the channel in the third semiconductor region 23 disappears, and the semiconductor device 100 is switched to the off-state.

Effects according to the embodiment will now be described.

Figure 9A:
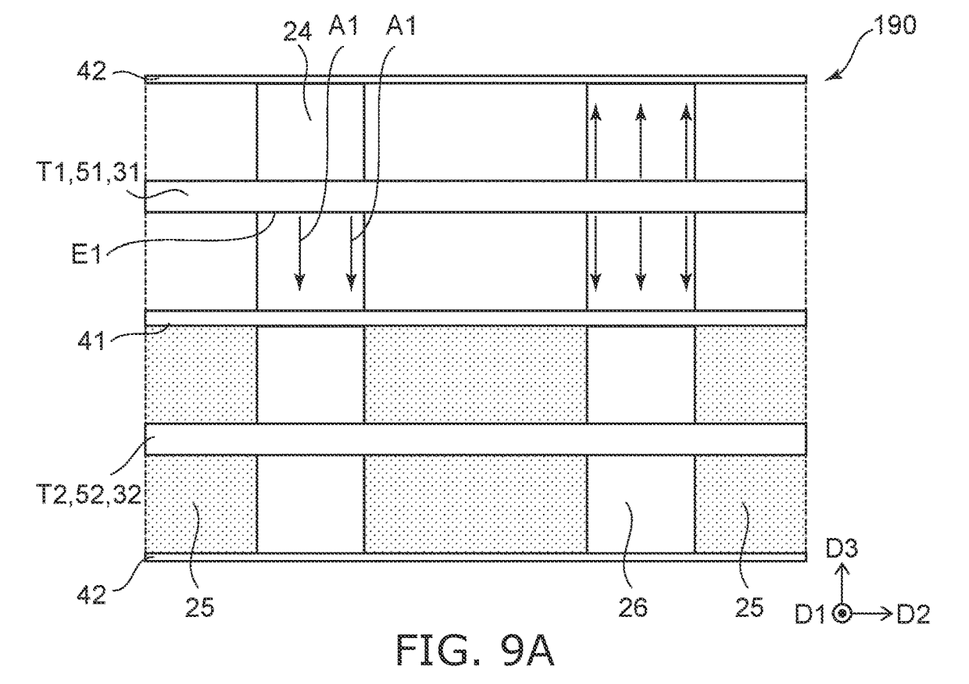
FIGS. 9A and 9B are schematic plan views illustrating semiconductor devices.
Figure 9B:
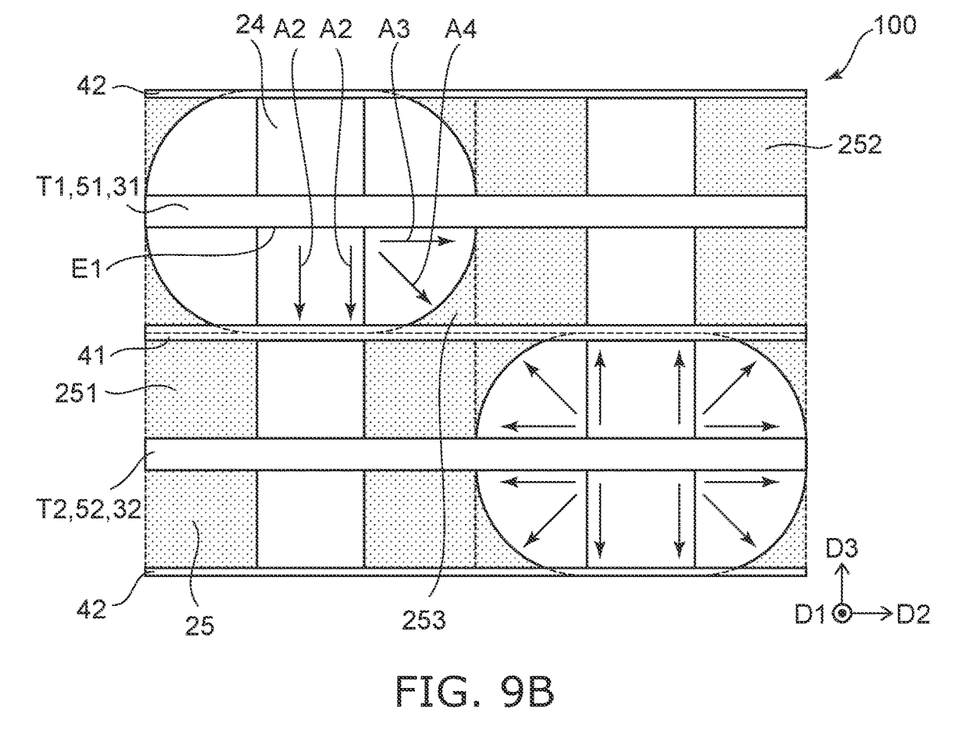

FIGS. 9A and 9B are schematic plan views illustrating semiconductor devices.

Similarly to FIG. 2, FIGS. 9A and 9B illustrate portions of the semiconductor devices. FIG. 9A illustrates a semiconductor device 190 of a reference example; and FIG. 9B illustrates the semiconductor device 100 according to the embodiment. The planar arrangement of the fifth semiconductor region 25 of the semiconductor device 190 of the reference example is different from that of the semiconductor device 100. In the semiconductor device 190 of the reference example, the fifth semiconductor region 25 does not include the second portion 252. For example, in the semiconductor device 190 of the reference example, the fifth semiconductor region 25 is arranged not in a checkered pattern but in a stripe configuration extending in the second direction D2.

Parasitic elements are included in semiconductor devices such as IGBTs, etc. For example, the semiconductor devices 100 and 190 each include a bipolar transistor formed of the second to fourth semiconductor regions 22 to 24. When latchup occurs and such a parasitic element is switched to the on-state, there is a risk that a discrepancy such as a misoperation, breakdown, etc., of the semiconductor device may occur.

For example, when the potential of the third semiconductor region 23 (the region between the second semiconductor region 22 and the fourth semiconductor region 24) becomes high, there is a risk that latchup may occur and the parasitic elements may be switched to the on-state. Therefore, the fifth semiconductor region 25 is included. The fifth semiconductor region 25 has a higher impurity concentration and a lower resistivity than the third semiconductor region 23. The resistance of the hole current in the region between the second semiconductor region 22 and the fourth semiconductor region 24 can be reduced thereby. For example, the rise of the potential of the region between the second semiconductor region 22 and the fourth semiconductor region 24 is suppressed. Thus, the latchup withstand capacity can be improved by including the fifth semiconductor region 25.

The holes at the boundary portion E1 vicinity flow from the third semiconductor region 23 via the fifth semiconductor region 25 toward the first contact region 41. Here, in FIG. 9A, for example, the path of the hole current flowing from the boundary portion E1 toward the fifth semiconductor region 25 is as shown by arrows A1. In other words, in FIG. 9A, the path of the hole current is a path in one direction along the third direction D3. On the other hand, in FIG. 9B, for example, the path of the hole current flowing from the boundary portion E1 toward the fifth semiconductor region 25 is as shown by arrows A2 and arrows A3. Arrow A2 is the path of the holes pulled into the first portion 251, and is a direction along the third direction D3. Arrow A3 is the path of holes pulled into the second portion 252, and is a direction along the second direction D2. Thus, according to the embodiment, by the fifth semiconductor region 25 including the first and second portions 251 and 252, for example, the hole current can be discharged not only in a direction orthogonal to the first conductive part 31 but also in a path in the parallel direction. The resistance of the hole current can be further reduced thereby, and the latchup withstand capacity can be further improved.

In the semiconductor device 100 as described with reference to FIG. 2, the corner portion c1 of the rectangular first portion 251 is connected with the corner portion c2 of the rectangular second portion 252. That is, the fifth semiconductor region 25 surrounds at least a portion of the periphery of the boundary portion E1 (e.g., the active FET region) with the first and second portions 251 and 252. Holes can be easily discharged in multiple directions thereby, and the resistance of the hole current can be further reduced. Accordingly, the latchup withstand capacity can be further improved.

As described with reference to FIG. 2, the distance L1 between the boundary portion E1 and the first portion 251 is, for example, not less than 0.9 times and not more than 1.1 times the distance L2 between the boundary portion E1 and the second portion 252 when viewed from above. For example, the distance L1 is equal to the distance L2. Thus, when the distance L1 is equal to the distance L2, the holes at the boundary portion E1 vicinity are more easily discharged in paths in both of the second and third directions D2 and D3. The resistance of the hole current can be further reduced thereby.

In the example, the fifth semiconductor region 25 further includes the connection portion 253 that connects the first portion 251 and the second portion 252. The outer perimeter of the connection portion 253 includes the curve 253E that connects the one side 251E of the first portion 251 and the one side 252E of the second portion 252 when viewed from above. That is, the fifth semiconductor region 25 surrounds at least a portion of the periphery of the boundary portion E1 with the first portion 251, the second portion 252, and the connection portion 253. Thereby, for example, holes also flow more easily to the fifth semiconductor region 25 in paths illustrated by arrow A4 of FIG. 9B. Arrow A4 is a path of the holes pulled toward the connection portion 253, and is along a direction that is between the second direction D2 and the third direction D3. Thereby, the holes are easily discharged in multiple directions; and the resistance of the hole current can be further reduced.

As described with reference to FIG. 2, the distance L1 is, for example, not less than 0.9 times and not more than 1.1 times the distance L3 between the boundary portion E1 and the connection portion 253 when viewed from above. For example, the distance L1 is equal to the distance L3. Thus, when the distance L1 is equal to the distance L3, the discharge occurs more easily not only in the third direction D3 but also in a path in a direction that is between the second direction D2 and the third direction D3. The resistance of the hole current can be further reduced thereby.

For example, as illustrated in FIG. 1B, the fourth semiconductor region 24 and the second portion 252 are repeatedly arranged periodically in the second direction D2. Thereby, the boundary portions E1 can be arranged in the second direction D2 with the second portion 252 when the multiple boundary portions E1 (MOSFETs) are arranged along the first conductive part 31.

As illustrated in FIG. 2, the semiconductor device 100 includes the second conductive part 32 and the second insulating film 52; and the first portion 251 of the fifth semiconductor region 25 contacts the second insulating film 52. In such a case, the first portion 251 is arranged in the second direction D2 with the boundary portion E2 (e.g., the active FET region). Thereby, for example, a portion of the holes at the boundary portion E2 vicinity is pulled toward the first portion 251 in a path in a direction along the second direction D2. That is, at the boundary portion E2 vicinity as well, the hole current can be discharged not only in the third direction D3 but also in a path in the second direction D2. The resistance of the hole current can be further reduced thereby, and the latchup withstand capacity can be further improved.

The first portion 251 includes the side portions 251a and 251b. The second portion 252 includes the side portions 252a and 252b. Thus, the fifth semiconductor region 25 is located at two sides in the third direction D3 of the first and second conductive parts 31 and 32. The resistance of the hole current at the two sides of the first and second conductive parts 31 and 32 can be further reduced thereby.

For example, as illustrated in FIG. 1B, the first conductive part 31, the second conductive part 32, the first contact region 41, and the first portion 251 are repeatedly arranged periodically in the third direction D3. Thereby, the boundary portion E1 (the MOSFET) that is next to each first conductive part 31 can be arranged in the third direction D3 with the first portion 251.

In the semiconductor device 100, the multiple first conductive parts 31 and the multiple second conductive parts 32 are connected to each other and have the same potential (gate potential). However, the embodiment is not limited thereto; some of the multiple first conductive parts 31 and multiple second conductive parts 32 may have a potential other than the gate potential. For example, some of the multiple first conductive parts 31 and multiple second conductive parts 32 may be electrically connected with the second electrode 12 and may have the same potential as the second electrode 12.

Figure 10:
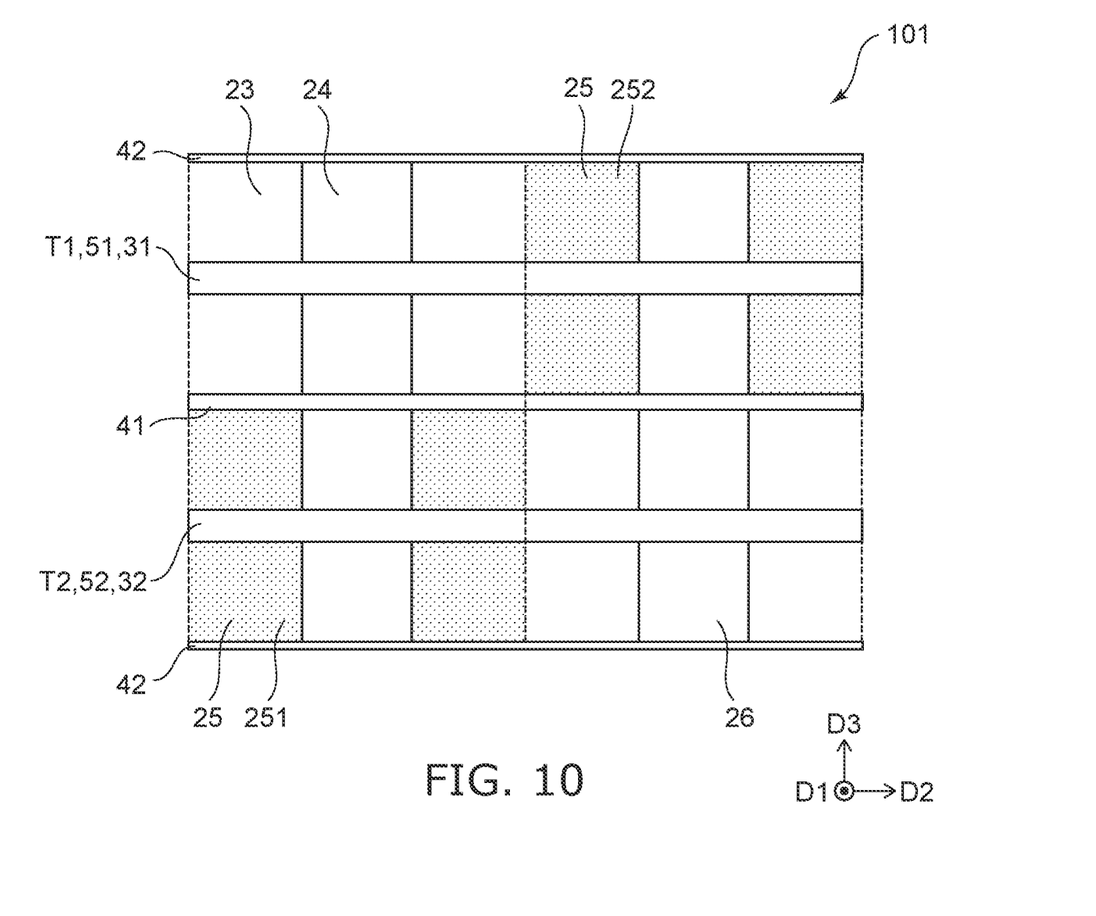
FIG. 10 is a schematic plan view illustrating another semiconductor device according to the embodiment.

FIG. 10 is a schematic plan view illustrating another semiconductor device according to the embodiment.

The shape of the fifth semiconductor region 25 of the semiconductor device 101 illustrated in FIG. 10 is different from that of the semiconductor device 100. In the semiconductor device 101, the fifth semiconductor region 25 does not include the connection portion 253. Otherwise, a description similar to the semiconductor device 100 is applicable to the semiconductor device 101.

In the semiconductor device 101 as well, the fifth semiconductor region 25 includes the first portion 251 and the second portion 252. Similarly to the semiconductor device 100, discrepancies due to latchup can be suppressed thereby.

According to the embodiment, the first portion 251 and the second portion 252 may not always be continuous. That is, the fifth semiconductor region 25 may include multiple discrete portions. In such a case as well, for example, the hole current can be discharged not only in a direction orthogonal to the first conductive part 31 but also in a path in the parallel direction. Accordingly, the latchup withstand capacity can be improved.

Figure 11:
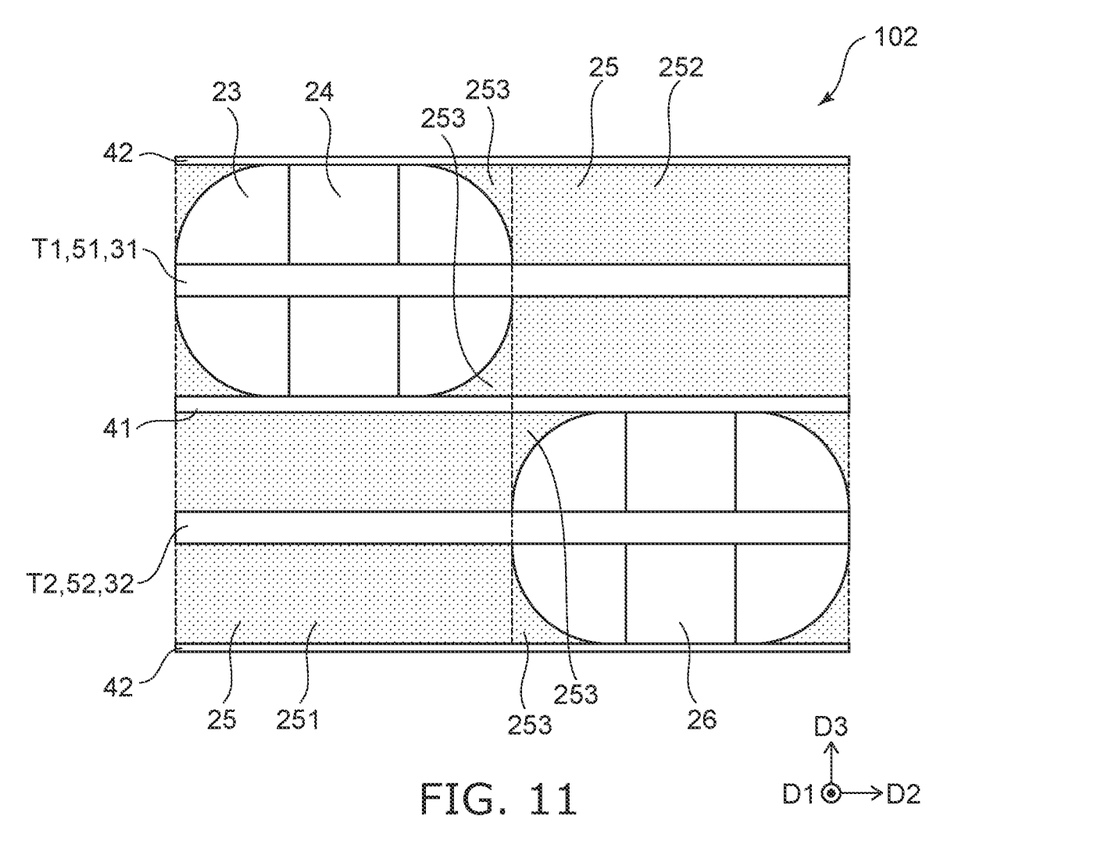
FIG. 11 is a schematic plan view illustrating another semiconductor device according to the embodiment.

FIG. 11 is a schematic plan view illustrating another semiconductor device according to the embodiment.

The planar shapes of the fourth and sixth semiconductor regions 24 and 26 of the semiconductor device 102 illustrated in FIG. 11 are different from those of the semiconductor device 100. In the semiconductor device 102, the fourth semiconductor region 24 and the sixth semiconductor region 26 are not located at positions overlapping the fifth semiconductor region 25. Otherwise, a description similar to the semiconductor device 100 is applicable to the semiconductor device 102.

When the unit structure is periodically arranged in the semiconductor device 102, instead of a stripe configuration extending in the third direction D3 as in the semiconductor device 100, the fourth semiconductor region 24 includes multiple discontinuous portions arranged in the third direction D3. Similarly, when the unit structure is periodically arranged in the semiconductor device 102, instead of a stripe configuration extending in the third direction D3 as in the semiconductor device 100, the sixth semiconductor region 26 has multiple discontinuous portions arranged in the third direction D3. The fourth semiconductor region 24 and the sixth semiconductor region 26 may not overlap in the second direction D2.

In the semiconductor device 102 as well, the fifth semiconductor region 25 includes the first portion 251 and the second portion 252. Similarly to the semiconductor device 100, discrepancies due to latchup can be suppressed thereby.

In the embodiments described above, the relative levels of the impurity concentrations between the semiconductor regions can be confirmed using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. The relative levels of the impurity concentrations between the semiconductor regions can be considered to be equivalent to the relative levels of the carrier concentrations between the semiconductor regions. The impurity concentration in each semiconductor region can be measured by, for example, SIMS (secondary ion mass spectrometry).

In this specification, being "electrically connected" includes not only the case of being connected in direct contact, but also the case of being connected via another conductive member, etc.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:
a first electrode;
a second electrode;
a first semiconductor region located on the first electrode, the first semiconductor region being of a first conductivity type;
a second semiconductor region located on the first semiconductor region, the second semiconductor region being of a second conductivity type;
a third semiconductor region located on the second semiconductor region, the third semiconductor region being of the first conductivity type;
a fourth semiconductor region located on a portion of the third semiconductor region and electrically connected with the second electrode, the fourth semiconductor region being of the second conductivity type;
a third electrode extending in a second direction and facing the third semiconductor region via a first insulating film in a third direction, the second direction being perpendicular to a first direction, the first direction being from the first semiconductor region toward the second semiconductor region, the third direction being perpendicular to the first and second directions;
a first contact region located on a portion of the third semiconductor region, arranged with the third electrode in the third direction, and electrically connected with the second electrode, the first contact region being of the first conductivity type and having a higher first-conductivity-type impurity concentration than the third semiconductor region; and
a fifth semiconductor region connected with the first contact region, the fifth semiconductor region being of the first conductivity type and having a higher firstconductivity-type impurity concentration than the third semiconductor region, the fifth semiconductor region including
- a first portion arranged in the third direction with a boundary portion between the first insulating film and the third semiconductor region between the second semiconductor region and the fourth semiconductor region, and
- a second portion arranged in the second direction with the boundary portion.

2. The device according to claim 1, wherein
the first portion and the second portion are rectangular when viewed from above, and
a corner portion of the first portion is connected with the corner portion of the second portion.

3. The device according to claim 1, wherein
a distance between the boundary portion and the first portion is not less than 0.9 times and not more than 1.1 times a distance between the boundary portion and the second portion when viewed from above.

4. The device according to claim 1, wherein
the fifth semiconductor region includes a connection portion connecting the first and second portions, and
an outer perimeter of the connection portion includes a curve connecting one side of the first portion and one side of the second portion when viewed from above.

5. The device according to claim 4, wherein
a distance between the boundary portion and the first portion is not less than 0.9 times and not more than 1.1 times a distance between the boundary portion and the connection portion when viewed from above.

6. The device according to claim 1, wherein
the fourth semiconductor region and the second portion each are repeatedly arranged periodically in the second direction.

7. The device according to claim 1, further comprising:
a fourth electrode arranged in the third direction with the third electrode,
the fourth electrode extending in the second direction,
the first contact region being positioned between the third electrode and the fourth electrode,
the fourth electrode facing the third semiconductor region via a second insulating film in the third direction; and
the first portion contacting the second insulating film.

8. The device according to claim 7, wherein
the third electrode, the fourth electrode, the first contact region, and the first portion each are repeatedly arranged periodically in the third direction.

* * * * *